US010937828B2

(12) United States Patent
Hashemi et al.

(10) Patent No.: US 10,937,828 B2
(45) Date of Patent: Mar. 2, 2021

(54) FABRICATING EMBEDDED MAGNETORESISTIVE RANDOM ACCESS MEMORY DEVICE WITH V-SHAPED MAGNETIC TUNNEL JUNCTION PROFILE

(71) Applicant: International Business Machines Corporation, Armonk, NY (US)

(72) Inventors: Pouya Hashemi, White Plains, CT (US); Matthias Georg Gottwald, New Rochelle, NY (US); Alexander Reznicek, Troy, NY (US); Chandrasekharan Kothandaraman, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/157,970

(22) Filed: Oct. 11, 2018

(65) Prior Publication Data

US 2020/0119088 A1  Apr. 16, 2020

(51) Int. Cl.
*H01L 27/22* (2006.01)
*H01L 43/08* (2006.01)
*H01L 43/10* (2006.01)
*H01L 43/02* (2006.01)
*H01L 43/12* (2006.01)
*G11C 11/15* (2006.01)
*G11C 11/56* (2006.01)
*G11C 11/16* (2006.01)

(52) U.S. Cl.
CPC ........ *H01L 27/222* (2013.01); *G11C 11/5607* (2013.01); *H01L 43/12* (2013.01); *G11C 11/161* (2013.01); *H01L 43/02* (2013.01); *H01L 43/08* (2013.01); *H01L 43/10* (2013.01)

(58) Field of Classification Search
CPC ...................................................... H01L 27/222
See application file for complete search history.

(56) References Cited

U.S. PATENT DOCUMENTS 6,421,271 B1   7/2002   Gogl et al.
6,438,026 B2   8/2002   Gillies et al.
(Continued)

OTHER PUBLICATIONS

Ditizio, R., Werbaneth, P., & Zhu, J. G. (Jan 2004). Cell Shape and Patterning Considerations for Magnetic Random Access Memory (MRAM) Fabrication. Published in Semiconductor Manufacturing magazine.

*Primary Examiner* — Moazzam Hossain
*Assistant Examiner* — Omar F Mojaddedi
(74) *Attorney, Agent, or Firm* — Garg Law Firm, PLLC; Rakesh Garg; Robert Sullivan

(57) ABSTRACT

Fabricating a magnetoresistive random access memory (MRAM) device includes receiving a wafer structure having a first inter-layer dielectric (ILD) layer and a metal material disposed within the first ILD layer. A second ILD layer is deposited upon a top surface of the first ILD layer and the metal material. A trench is formed within the second ILD layer extending to the top surface of the metal material. A plurality of magnetic stack layers of a magnetic stack and an electrode layer are deposited within the trench. Portions of each of the magnetic stack layers of the magnetic stack and the electrode layer are removed to form a v-shaped magnetic tunnel junction (MTJ) in contact with the metal material.

6 Claims, 11 Drawing Sheets

(56) References Cited

U.S. PATENT DOCUMENTS

| | | | |
|---|---|---|---|
| 6,743,642 B2 | 6/2004 | Costrini et al. | |
| 6,943,040 B2 | 9/2005 | Min et al. | |
| 7,306,954 B2 * | 12/2007 | Nejad | H01L 27/222 |
| | | | 438/3 |
| 9,349,392 B1 * | 5/2016 | Zeng | G11B 5/1272 |
| 9,673,386 B2 | 6/2017 | Annunziata et al. | |
| 9,818,935 B2 | 11/2017 | Chuang et al. | |
| 9,842,986 B2 | 12/2017 | Chuang et al. | |
| 2011/0233696 A1 * | 9/2011 | Li | H01L 43/12 |
| | | | 257/421 |
| 2016/0079307 A1 * | 3/2016 | Lu | H01L 43/02 |
| | | | 257/421 |
| 2016/0247524 A1 | 8/2016 | Zeng et al. | |
| 2017/0279036 A1 * | 9/2017 | Mo | H01L 43/08 |

* cited by examiner

FABRICATING EMBEDDED MAGNETORESISTIVE RANDOM ACCESS MEMORY DEVICE WITH V-SHAPED MAGNETIC TUNNEL JUNCTION PROFILE

TECHNICAL FIELD

The present invention relates generally to a method for fabricating magnetoresistive random access memory (MRAM) devices and an apparatus formed by the method. More particularly, the present invention relates to a method for fabricating an embedded MRAM device with a v-shaped magnetic tunnel junction (MTJ) profile and an apparatus formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto a wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Magnetoresistive random access memory (MRAM) is a method of storing data bits using magnetic states instead of electrical charges used by dynamic random access memory (DRAM). In contrast to DRAM which uses electrical charges to determine if a bit is a binary 1 or 0, MRAM uses a pair of ferromagnetic metal plates separated by a thin insulating layer. One of the ferromagnetic metal plates is a permanent magnet which is always magnetized, and the other ferromagnetic metal plate can be selectively magnetized. The orientation of the two magnetic moments produced by the ferromagnetic metal plates defines the 1 or 0 binary bit. This basic structure is called a magnetic tunnel junction (MTJ). The MTJ functions due to electron tunneling. An insulating layer of a few Angstroms thickness allows electrons to tunnel through it from one plate to the other. The amount of tunneling that occurs depends upon the orientation of the magnetic fields of each plate as being either in parallel or not in parallel. A resulting change in the electrical resistance of the MTJ determines whether the binary bit is a 1 or 0. Arrays of MTJs form a memory device in a similar manner that arrays of transistors form random access memory (RAM).

SUMMARY

The illustrative embodiments provide a method and an apparatus formed by the method. An embodiment of a method includes receiving a wafer structure having a first inter-layer dielectric (ILD) layer and a metal material disposed within the first ILD layer. The embodiment further includes depositing a second ILD layer upon a top surface of the first ILD layer and the metal material, and forming a trench within the second ILD layer extending to the top surface of the metal material. The embodiment further includes depositing a plurality of magnetic stack layers of a magnetic stack and an electrode layer within the trench. The embodiment still further includes removing portions of each of the magnetic stack layers of the magnetic stack and the electrode layer to form a v-shaped magnetic tunnel junction (MTJ) in contact with the metal material.

Another embodiment further includes depositing a third ILD layer on a top surface of the second ILD layer and a top surface of the MTJ. Another embodiment further includes forming a via within the third ILD layer in contact with the MTJ. Another embodiment further includes planarizing the via using a planarization process. Another embodiment further includes forming a bit line on an upper surface of the third ILD layer and the via.

In another embodiment, removing portions of each of the magnetic stack layers and the electrode layer includes planarizing the magnetic stack layers and the electrode layer using a planarization process. In another embodiment, the planarization process includes a chemical mechanical planarization (CMP) process.

In another embodiment, the v-shaped MTJ includes a portion in contact with the metal material. In another embodiment, the v-shaped magnetic tunnel junction (MTJ) is of an inverted pyramidal shape. In another embodiment, the trench includes a trapezoidal-shaped portion at the metal material.

In another embodiment, the trench is formed using a reactive-ion etching (RIE) process using fluoro-carbon based chemistry. In another embodiment, the magnetic stack layers and electrode layer are deposited using conformal deposition.

In another embodiment, the magnetic stack layers and the electrode layer conform to a contour of the trench. In another embodiment, the magnetic stack layers and the electrode layer are deposited using an atomic layer deposition (ALD) process.

An embodiment of an apparatus includes a wafer structure having a first inter-layer dielectric (ILD) layer and a metal material disposed within the first ILD layer. The embodiment further includes a second ILD layer upon a top surface of the first ILD layer and the metal material, and a trench within the second ILD layer extending to the top surface of the metal material. The embodiment further includes a v-shaped magnetic tunnel junction (MTJ) in contact with the metal material. In the embodiment, the MTJ includes a plurality of magnetic stack layers of a magnetic stack and an electrode layer within the trench.

In another embodiment, the trench includes a trapezoidal-shaped portion. In another embodiment, the v-shaped MTJ includes a portion in contact with the metal material.

An embodiment includes a computer usable program product. The computer usable program product includes one or more computer-readable storage devices, and program instructions stored on at least one of the one or more storage devices.

In an embodiment, the computer usable code is stored in a computer readable storage device in a data processing system, and wherein the computer usable code is transferred over a network from a remote data processing system.

In an embodiment, the computer usable code is stored in a computer readable storage device in a server data processing system, and wherein the computer usable code is downloaded over a network to a remote data processing system for use in a computer readable storage device associated with the remote data processing system.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
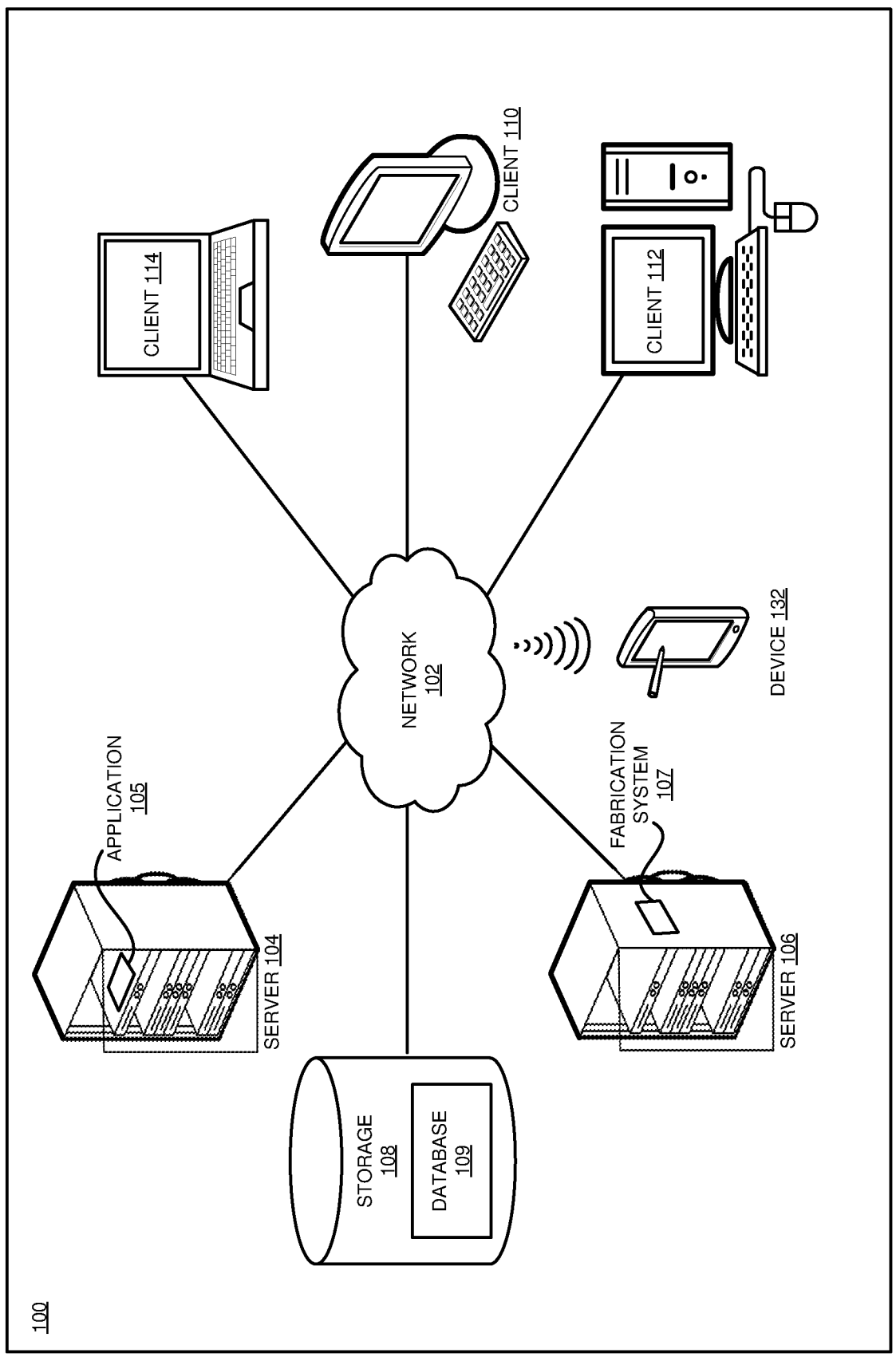
FIG. 1 depicts a block diagram of a network of data processing systems in which illustrative embodiments may be implemented.

The illustrative embodiments relate to a method, for fabricating an embedded MRAM device with a v-shaped magnetic tunnel junction (MTJ) profile and an apparatus formed by the method. The illustrative embodiments recognize that MRAM has drawn significant attention for embedded applications and the availability of magnetic stacks that are compatible with back end of line (BEOL) process temperatures have been shown. The BEOL process is the portion of an IC fabrication process in which individual devices are interconnected with wiring on a wafer. The illustrative embodiments recognize that the present methods and techniques for fabricating MRAM suffer from several problems.

In a conventional MRAM fabrication process, the MTJ of the MRAM is formed utilizing blanket metal deposition followed by an MRAM bit etch using reactive-ion etching (RIE) and/or ion beam etching (IBE) processes. The illustrative embodiments further recognize that the use of RIE/IBE processes limits density due to shadowing. The illustrative embodiments further recognize that RIE based processing adds complexity to the overall yield, and full IBE may have limitations of MRAM pitch size. The illustrative embodiments further recognize that IBE may result into redeposition of sputtered metal onto the MTJ sidewall, resulting in potential shorting or other degradation of device performance.

Various embodiments described herein provide for MRAM fabrication using an RIE/IBE free process flow during MTJ formation in which trapezoidal-shaped trenches are formed at a desired angle and filled with magnetic stack material followed by planarizing, such as using a chemical mechanical planarization (CMP) process, the magnetic stack to avoid complexity and other issues related to an RIE/IBE etching processes. One or more embodiments provide for a structure formed by the method in which an MRAM has a MTJ having a v-shaped or inverted-pyramidal profile.

In an embodiment of a process for fabricating an embedded MRAM device with a v-shaped magnetic tunnel junction (MTJ) profile, a fabrication system receives a wafer structure having a bottom inter-layer dielectric (ILD) layer embedded with a back end metal material as a result of a BEOL process, referred to hereinafter as a BEOL wafer. In particular embodiments, the back end metal material includes one or more of copper or titanium nitride (TiN). In particular embodiments, the back end metal has a width of between 10 nanometers (nm) and 100 nm. In the embodiment, the fabrication system deposits a first MRAM ILD layer upon a top surface of the bottom ILD layer and the back end metal. In a particular embodiment, the first MRAM ILD layer is a formed of a low-K dielectric material (e.g., having a small dielectric constant relative to silicon dioxide) such as silicon oxide (SiOx), silicon nitride (SiNx), silicon oxynitride (SiON), or siliconboron carbonitride (SiBCN). In particular embodiments, the first MRAM ILD layer has a thickness of between 10 nm-50 nm.

In the embodiment, the fabrication system patterns the MRAM level and performs ILD RIE using fluoro-carbon (FC) based chemistry to form a trapezoidal-shaped MTJ trench having a desired angle within the first MRAM ILD layer extending to the top surface of the back end metal. In particular embodiments, the fabrication system forms the trapezoidal-shaped MTJ trench with an angle between approximately 40 degrees and 60 degrees depending upon the device effective critical dimension (CD). As a result, a MTJ trench with a trapezoidal shaped bottom is formed.

In the embodiment, the fabrication system deposits in-situ a number of magnetic stack layers of a magnetic stack forming a MTJ and a top electrode layer within the MTJ trench. In particular embodiments, the fabrication system deposits the magnetic stack layers and top electrode layer using an atomic layer deposition (ALD) process such as ALD sputtering.

In the embodiment, the fabrication system planarizes the magnetic stack layers and top electrode layer to remove portions of the magnetic stack layers and top electrode layer to form a v-shaped or an inverted pyramidal-shaped MTJ having a bottom in contact with the back end metal. In a particular embodiment, the fabrication system planarizes the magnetic stack layers and top electrode layer using a CMP process.

In the embodiment, the fabrication system deposits a second MRAM ILD layer on a top surface of the first MRAM ILD layer and a top surface of the MTJ. In particular embodiments, a thickness of the second MRAM ILD layer is between 20 nm and 100 nm. In the embodiment, the fabrication system patterns the second ILD layer to form a top via tunnel through the second ILD layer to an upper surface of the MTJ, and fills the top via tunnel with a metal material to form a top via in contact with the MTJ. In the embodiment, the fabrication system planarizes the top via using a planarization process such as a CMP process. In the embodiment, the fabrication system forms a top bit line on an upper surface of the second ILD layer and the top via. In the embodiment, the top bit line is in electrical contact with MTJ via the top via. Accordingly, an embedded MRAM device with a v-shaped magnetic tunnel junction (MTJ) profile is fabricated according to an embodiment.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate MRAMs.

For the clarity of the description, and without implying any limitation thereto, the illustrative embodiments are described using MRAM structures disposed on a wafer. An embodiment can be implemented with different types and/or numbers of MRAM devices, a different number of MTJs, and/or a different number of wafers within the scope of the illustrative embodiments.

Furthermore, a simplified diagram of the example MRAM devices are used in the figures and the illustrative embodiments. In an actual fabrication of an MRAM, additional structures that are not shown or described herein may be present without departing the scope of the illustrative embodiments. Similarly, within the scope of the illustrative embodiments, a shown or described structure in the example MRAMs may be fabricated differently to yield a similar operation or result as described herein.

Differently shaded portions in the two-dimensional drawing of the example MRAMs are intended to represent different structures in the example MRAMs, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating MRAMs according to the illustrative embodiments.

Furthermore, the illustrative embodiments are described with respect to MRAMs only as an example. The steps described by the various illustrative embodiments can be adapted for fabricating other planar and non-planar devices employing magnetic stack layers in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating embedded MRAM devices.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
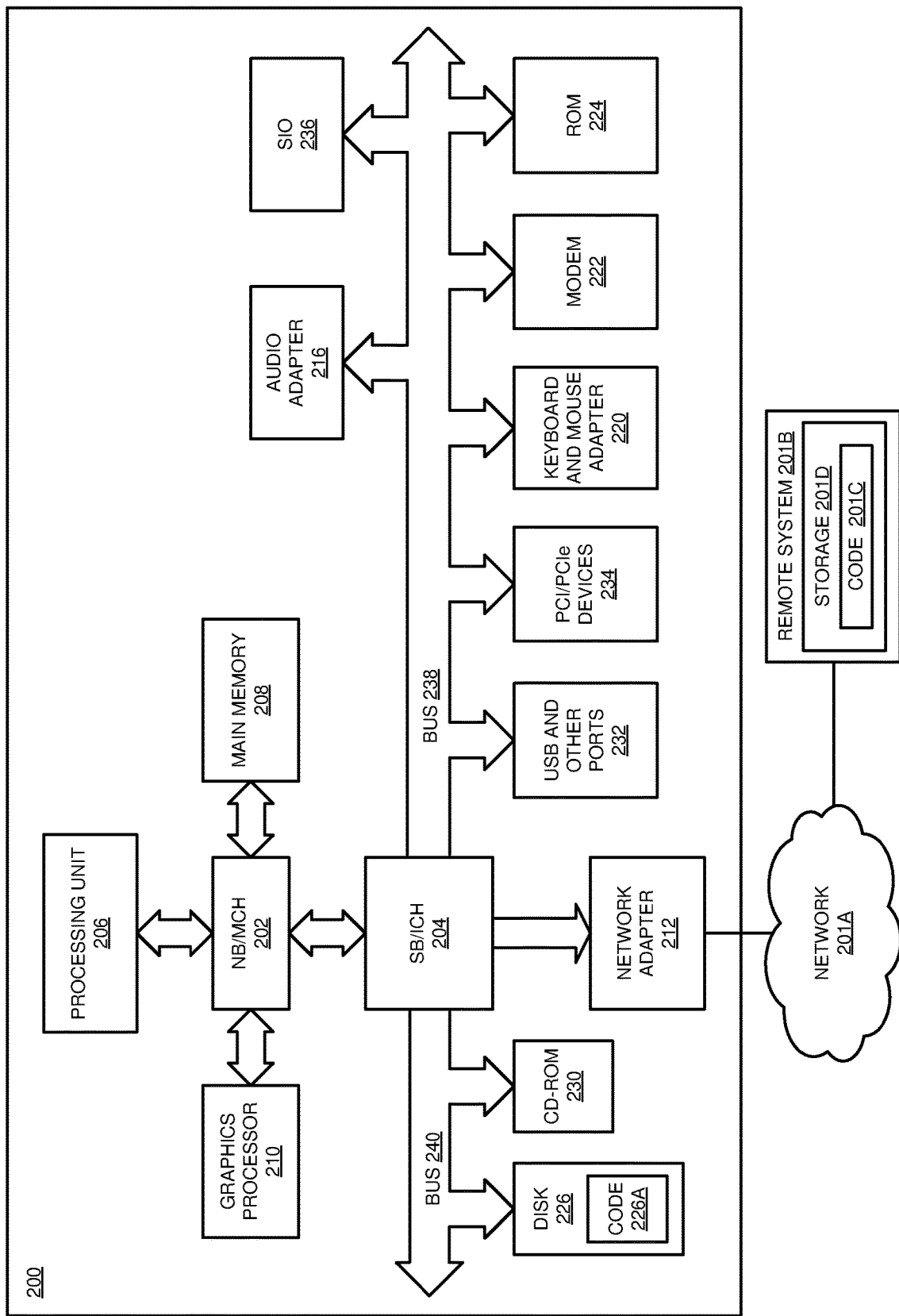
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device or other integrated circuit device. Application 105 provides instructions to fabrication system 107 for fabricating one or more MRAMs in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service-oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. In another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

With reference to FIGS. 3-9, these figures depict an example process for fabricating an embedded MRAM device with a v-shaped magnetic tunnel junction (MTJ) profile in accordance with one or more illustrative embodiments.

Figure 3:
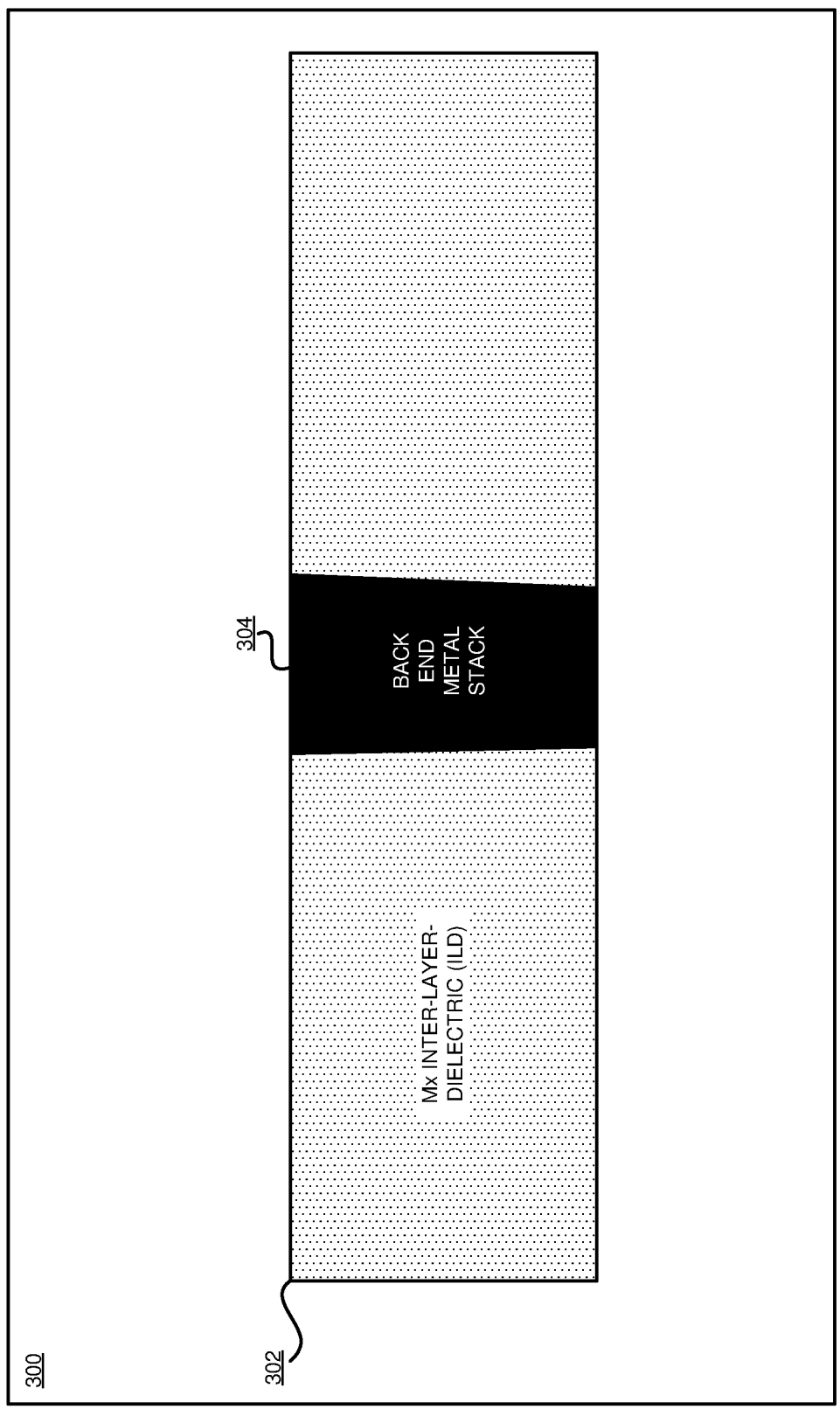
FIG. 3 depicts a portion of a process for fabricating an embedded MRAM device with a v-shaped magnetic tunnel junction (MTJ) profile according to an illustrative embodiment.

With reference to FIG. 3, this figure depicts a portion of a process in which an example wafer structure 300 is received according to an illustrative embodiment. Application 105 in FIG. 1 interacts with fabrication system 107 to produce or manipulate wafer structure 300 as described herein. In the embodiment, wafer structure 300 includes a bottom (Mx) inter-layer dielectric (ILD) layer 302 embedded with a back end metal 304 in which Mx is defined an x-th metallization layer in a wafer produced by a BEOL process. In particular embodiments, back end metal 304 includes one or more of copper (Cu), titanium nitride (TiN), titanium (Ti), tantalum (Ta), tantalum nitride (TaN), ruthenium (Ru), and tungsten (W).

Figure 4:
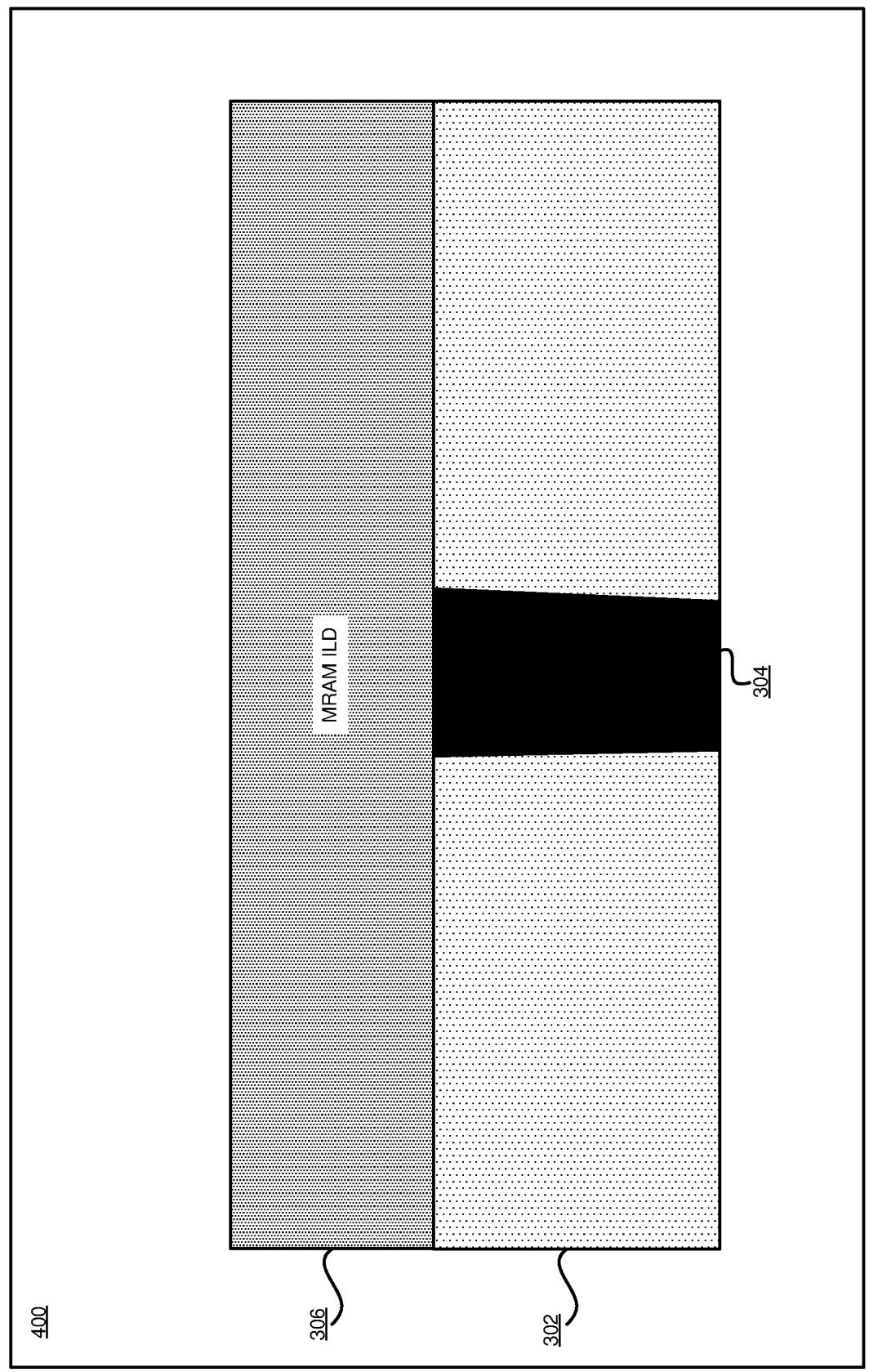
FIG. 4 depicts another portion of the process according to an illustrative embodiment.

With reference to FIG. 4, this figure depicts another portion of a process in which a structure 400 is formed according to an embodiment. In the embodiment, fabrication system 107 deposits a first MRAM ILD layer 306 upon a top surface of bottom ILD layer 302 and back end metal 304. In a particular embodiment, first MRAM ILD layer 306 is a formed of a low-K dielectric material (e.g., having a small dielectric constant relative to silicon dioxide) such as silicon oxide (SiOx), silicon nitride (SiNx), silicon oxynitride (SiON), or siliconboron carbonitride (SiBCN).

Figure 5:
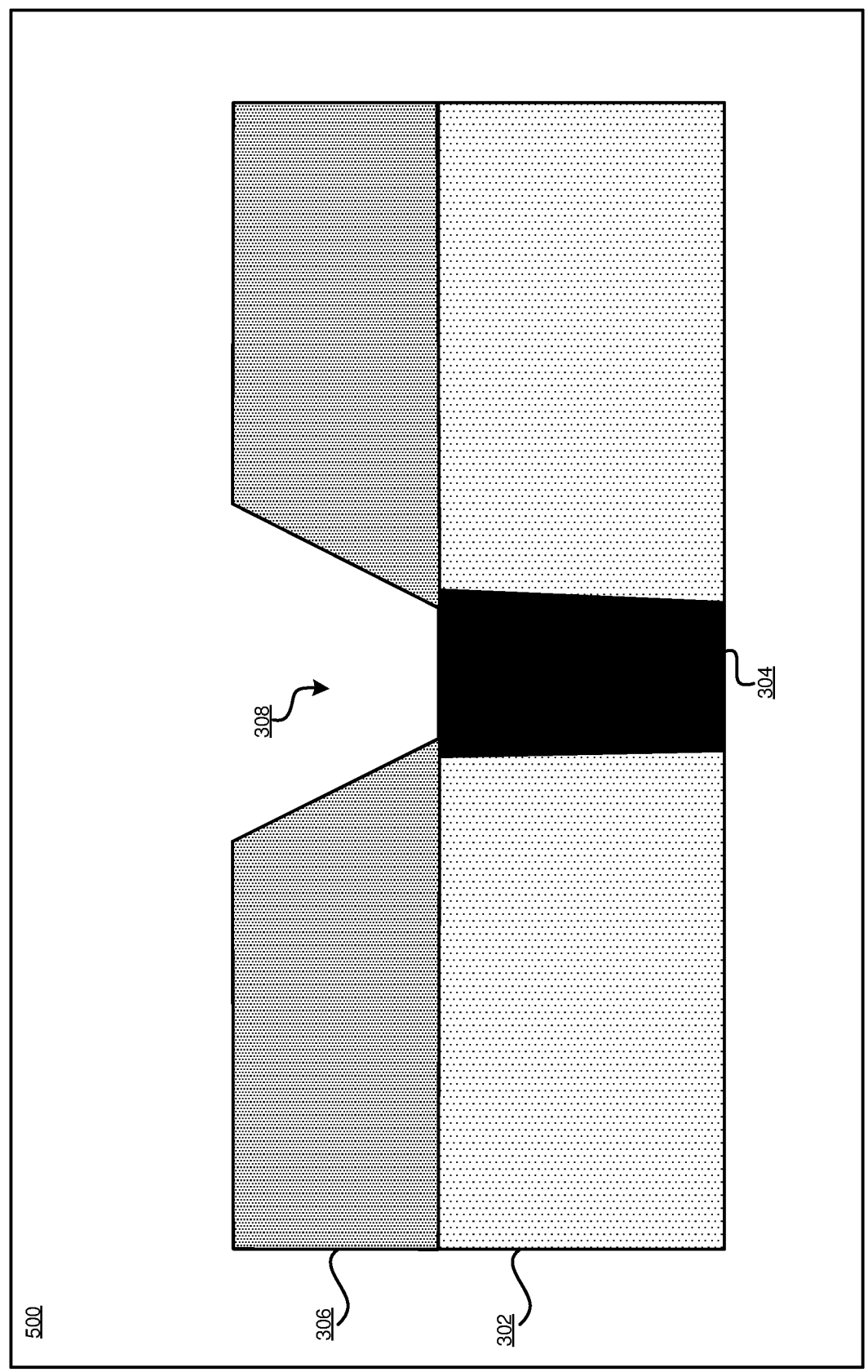
FIG. 5 depicts another portion of the process according to an illustrative embodiment.

With reference to FIG. 5, this figure depicts another portion of a process in which structure 500 is formed according to an embodiment. In the embodiment, fabrication system 107 patterns the MRAM level and forms a MTJ trench 308 having a desired angle within first MRAM ILD layer 306 extending to the top surface of back end metal 304 in which MTJ trench 308 has trapezoidal-shaped bottom at back end metal 304. In a particular embodiment, fabrication system 107 forms MTJ trench 308 via an RIE process using fluoro-carbon (FC) based chemistry process. In particular embodiments, fabrication system 107 forms MTJ trench 308 having angles between approximately 40 degrees and 60 degrees depending upon the device effective critical dimension (CD).

Figure 6:
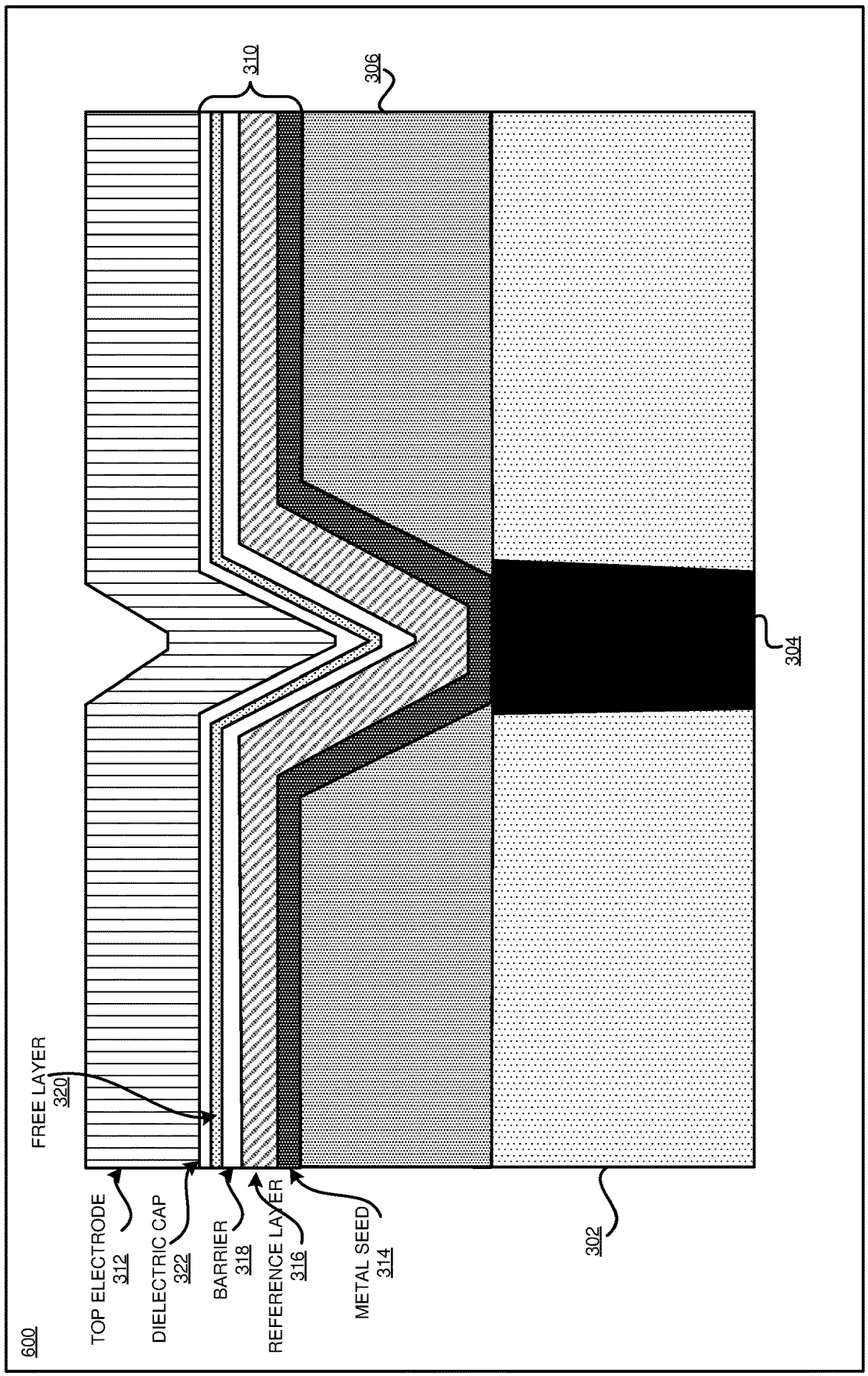
FIG. 6 depicts another portion of the process according to an illustrative embodiment.

With reference to FIG. 6, this figure depicts another portion of a process in which a structure 600 is formed according to an embodiment. In one or more embodiments, fabrication system 107 deposits in-situ a plurality of magnetic stack layers of a magnetic stack 310 and a top electrode layer 312 within MTJ trench 308. In one or more embodiments, fabrication system 107 deposits the magnetic stack layers of magnetic stack 310 and top electrode layer 312 using conformal deposition in which the magnetic stack layers of magnetic stack 310 and top electrode layer 312 conform to the contours of MTJ trench 308. In particular embodiments, fabrication system 107 deposits the magnetic stack layers of magnetic stack 310 and top electrode layer 312 using an atomic layer deposition (ALD) process such as ALD sputtering.

In the illustrated embodiment, the plurality of magnetic stack layers of magnetic stack 310 include a metal seed layer 314, a reference layer 316, a barrier layer 318, a free layer 320, and a dielectric cap layer 322. In the embodiment, metal seed layer 314 is deposited upon an upper surface of first MRAM ILD layer 306 and MTJ trench 308, reference layer 316 is deposited upon metal seed layer 314, barrier layer 318 is deposited upon reference layer 316, free layer 320 is deposited upon barrier layer 318, dielectric cap layer 322 is deposited upon free layer 320, and top electrode layer 312 is deposited upon dielectric cap layer 322. In one or more embodiments, reference layer 316 functions as a first magnetic electrode and free layer 320 functions as a second magnetic electrode of the MTJ.

In particular embodiments, metal seed layer 314 is formed of one or more of tantalum nitride (Ta(N)), iridum-doped Ta(N) (Ta(N)|Ir), platinum-doped Ta(N) (Ta(N)|Pt), ruthenium-doped Ta(N) (Ta(N)|Ru) or trilayer combinations with individual layer thicknesses of 10-100 angstroms (A). In particular embodiments, reference layer 316 is formed of one or more of [Co|Pt]×N multilayers with 1<N<15; antiferromagnetically coupled [Co|Pt]×N multilayers: [Co|Pt]×N|Co|Ru (or Ir)|[Co|Pt]×M, with 1<N<15 and 1<M<15, Ru (or Ir) thickness ~4-6 A or 8-10 A (for Ru only), individual Co or Pt layer thicknesses between 1 to 15 A; [Co|Ir]×N multilayers with 1<N<15 and individual Co thicknesses between 1-15 A, Ir thickness 4-6A; or one or more of the foregoing coupled to a CoFeB polarization enhancement layer (PEL) (7-12 A) through a 1-5 A thick Ta or W layer.

In one or more embodiments, barrier layer 318 is formed of a magnesium oxide (MgO) material. In particular embodiments, barrier layer 318 is formed by one or more of 8-14 A thick layers of MgO deposited by RF sputtering from a stoichiometric MgO target or through native oxidation of deposited metallic Mg. In particular embodiments, free layer 320 is formed of CoFeB layers with individual atomic percentages from 0 to 100% and a total thickness between 15-30 A.

In one or more embodiments, dielectric cap layer 322 is formed of an oxide material. In particular embodiments, dielectric cap layer 322 is formed of one or more of MgO, aluminum oxide (AlOx), or tantalum oxide (TaOx) having a thickness <10 A.

Figure 7:
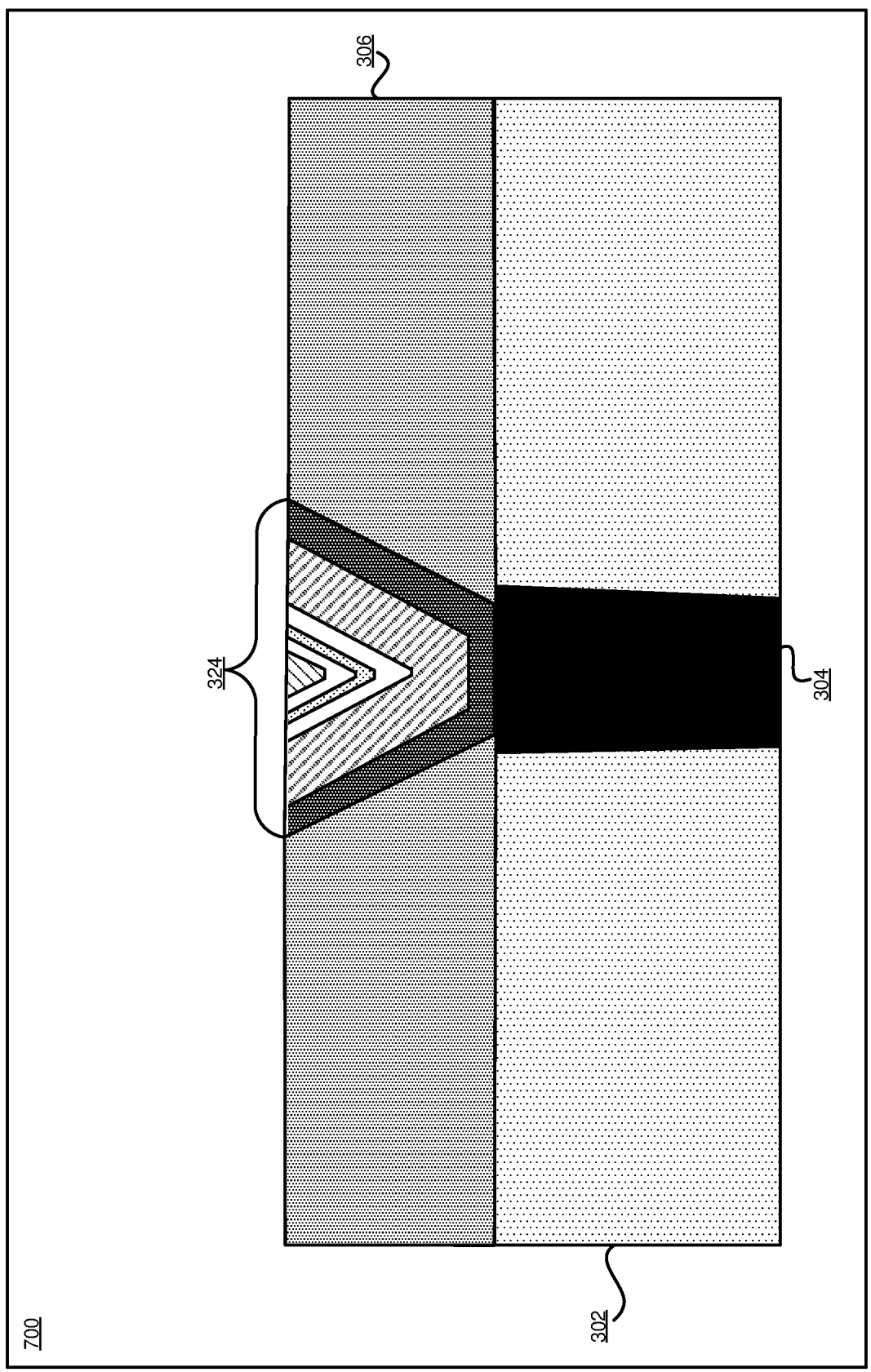
FIG. 7 depicts another portion of the process according to an illustrative embodiment.

With reference to FIG. 7, this figure depicts another portion of a process in which a structure 700 is formed according to an embodiment. In the embodiment, fabrication system 107 planarizes the magnetic stack layers of magnetic stack 310 and top electrode layer 312 to remove portions of the magnetic stack layers of magnetic stack 310 and top electrode layer 312 to form a v-shaped or inverted pyramidal-shaped MTJ 324 having a trapezoidal bottom in contact with back end metal 304. In a particular embodiment, fabrication system 107 planarizes the magnetic stack layers of magnetic stack 310 and top electrode layer 312 using a CMP process.

Figure 8:
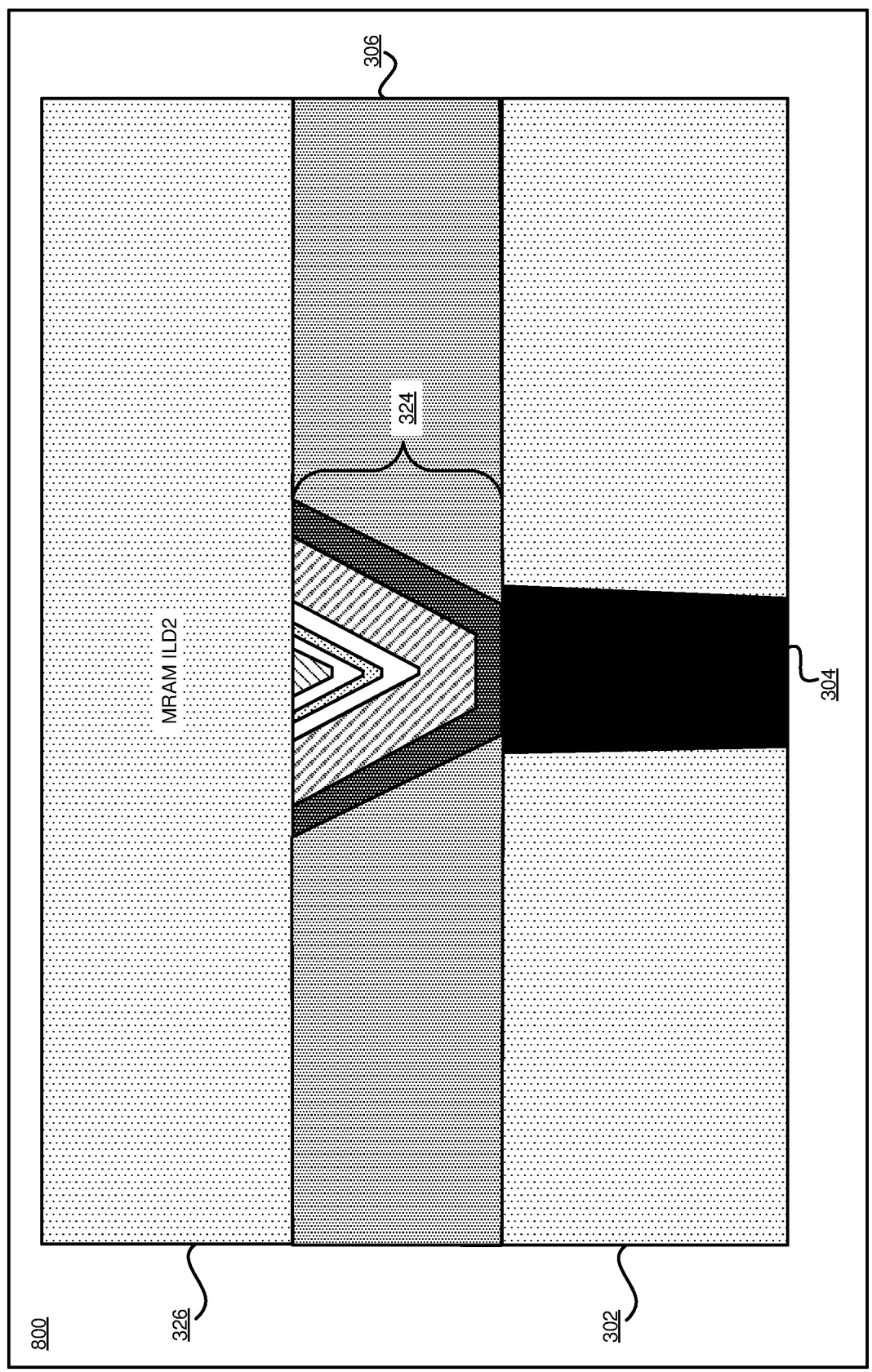
FIG. 8 depicts another portion of the process according to an illustrative embodiment.

With reference to FIG. 8, this figure depicts another portion of a process in which a structure 800 is formed according to an embodiment. In the embodiment, fabrication system 107 deposits a second MRAM ILD layer (ILD2) 326 on a top surface of first MRAM ILD layer 306 and a top surface of the MTJ 324.

Figure 9:
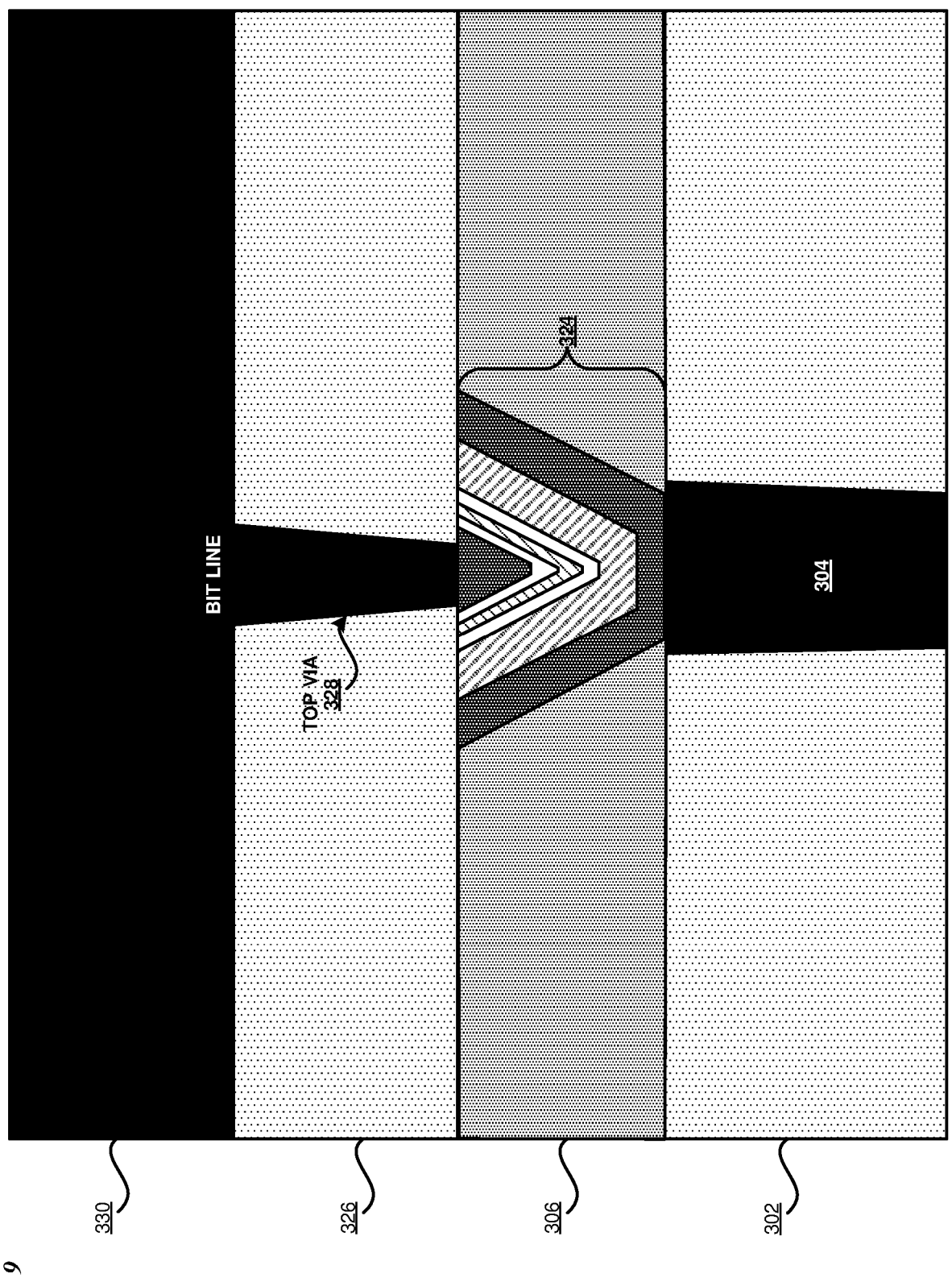
FIG. 9 depicts another portion of the process according to an illustrative embodiment.

With reference to FIG. 9, this figure depicts another portion of a process in which a structure 900 is formed according to an embodiment. In the embodiment, fabrication system 107 patterns second ILD layer 326 to form a top via tunnel through second ILD layer 326 to an upper surface of MTJ 324, and fills the top via tunnel with a metal material to form a top via 328 in contact with MTJ 324.

In the embodiment, fabrication system 107 planarizes top via 328 using a planarization process such as a CMP process. In the embodiment, fabrication system 107 forms a top bit line 330 on an upper surface of second MRAM ILD layer 326 and top via 328. In a particular embodiment, fabrication system 107 forms top bit line 330 via one or more of a deposition process, an etch process, or a CMP process. In the embodiment, top bit line 330 is in electrical contact with MTJ 324 via top via 328. Accordingly, an embedded MRAM device with a v-shaped magnetic tunnel junction (MTJ) profile is fabricated according to an embodiment.

Figure 10:
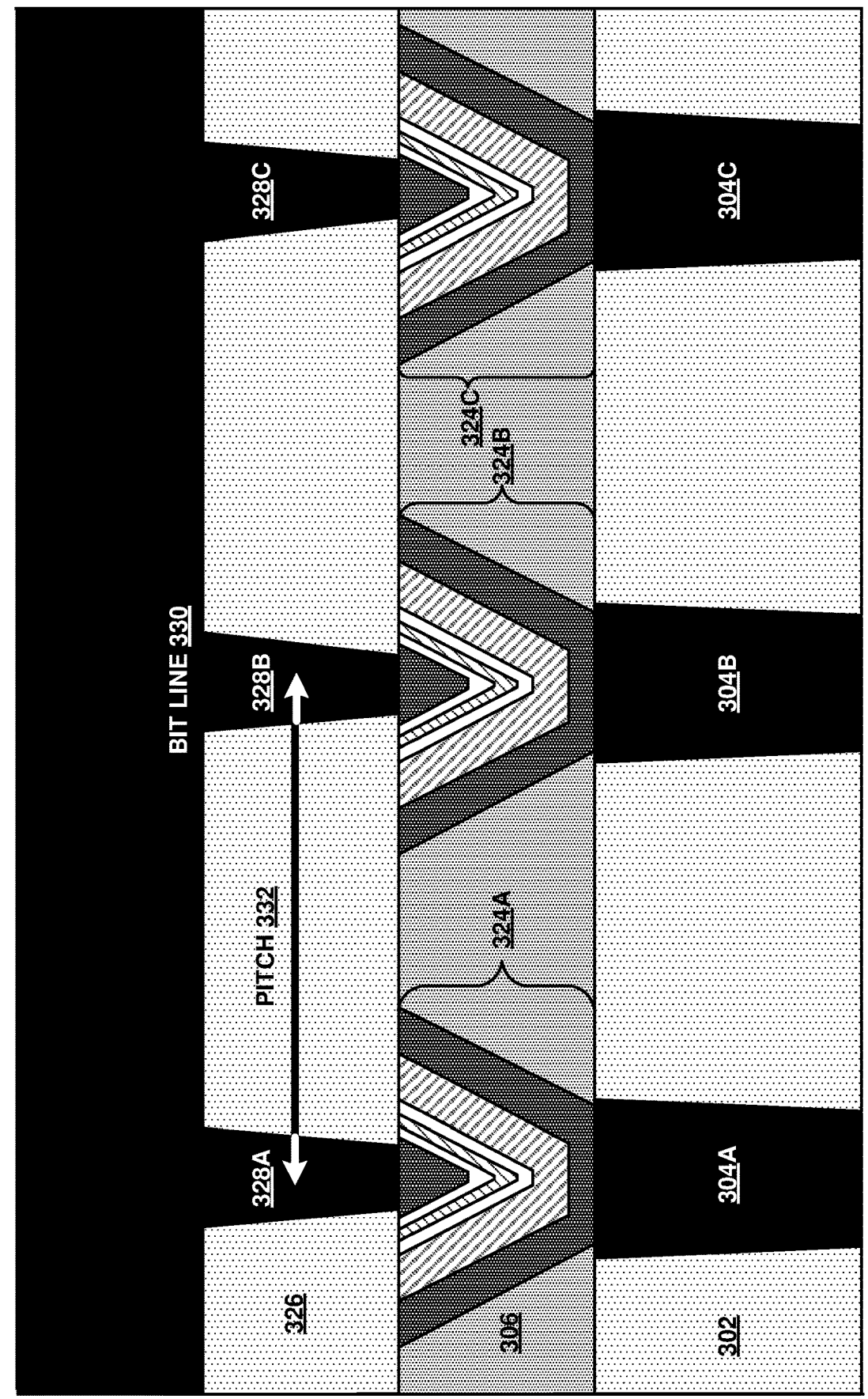
FIG. 10 depicts a multibit MRAM device structure according to an illustrative embodiment.

With reference to FIG. 10, this figure depicts a multibit MRAM device structure 1000 according to an illustrative embodiment. In the embodiments, FIG. 10 illustrates three MTJs of a multibit array of an MRAM device fabricated in the manner as described with respect to FIGS. 3-9. In the embodiment, although three MTJs are shown to illustrate neighboring MTJs and pitch therebetween, it should be understood that the multibit MRAM device may include any number of MTJs in an array such as a megabit array or a gigabit array of MTJs. In the embodiment, a first back end metal 304A, a second back end metal 304B, and a third back end metal 304C are disposed within bottom ILD 302. In the embodiment, structure 1000 includes a first MTJ 324A, a second MTJ 324B, and a third MTJ 324C within first MRAM ILD layer 306 in contact with first back end metal 304A, second back end metal 304B, and third back end metal 304C, respectively.

In the embodiment, structure 1000 further includes a first top via 328A, a second top via 328B, and a third top via 328C within second MRAM ILD layer 326 in contact with first MTJ 324A, second MTJ 324B, and third MTJ 324C, respectively. In the embodiment, structure 1000 further includes bit line 330 in contact with each of top via 328A, second top via 328B, and third top via 328C.

Figure 11:
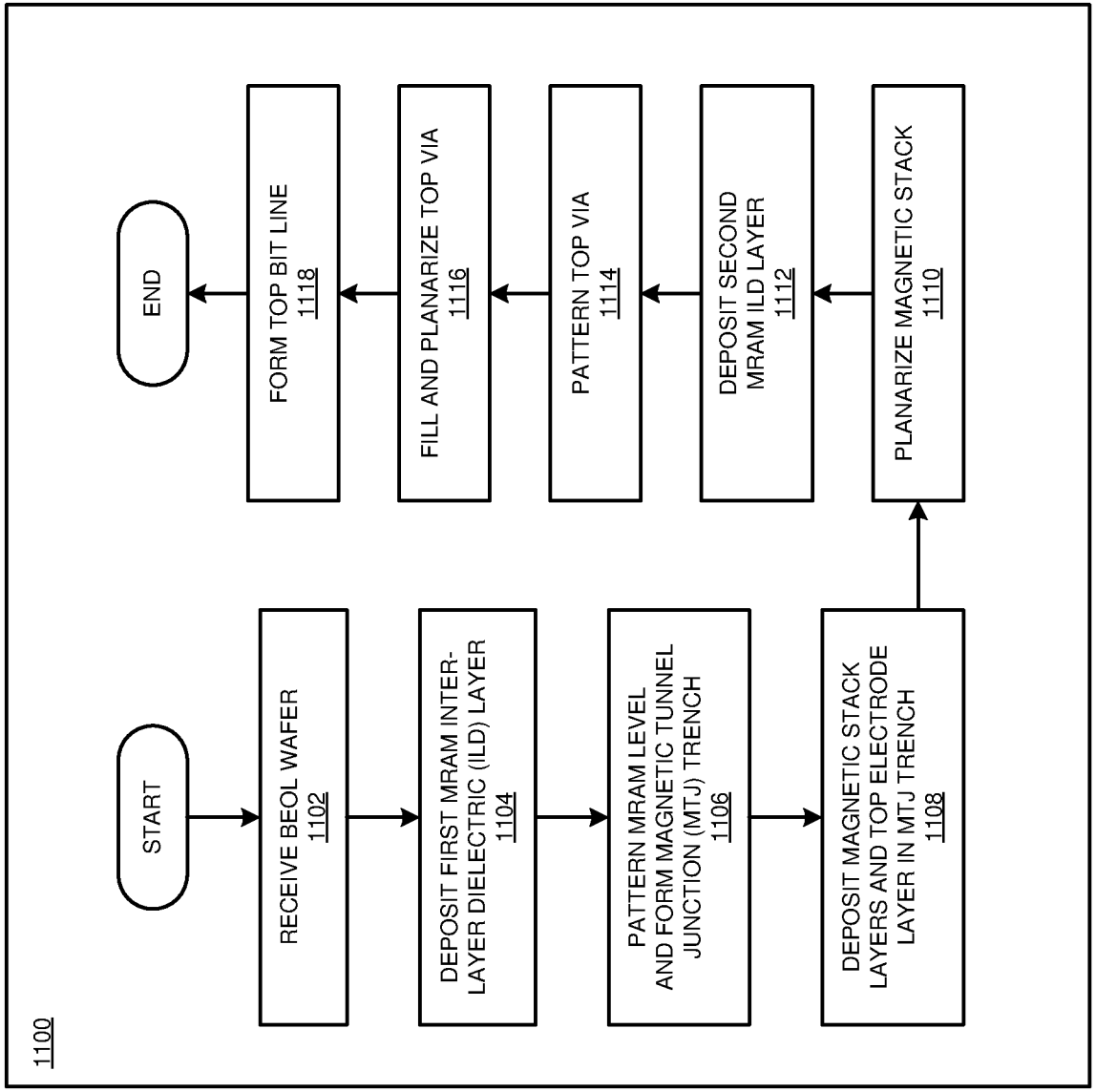
FIG. 11 depicts a flowchart of an example process for fabricating MRAM in accordance with an illustrative embodiment.

With reference to FIG. 11, this figure depicts a flowchart of an example process 1100 for fabricating an embedded MRAM device with a v-shaped magnetic tunnel junction (MTJ) profile in accordance with one or more illustrative embodiments. Process 1100 can be implemented in fabrication system 107 in FIG. 1, to perform one or more steps of FIGS. 3-10 as needed in process 1100.

In block 1102, fabrication system 107 receives a wafer structure 300 including bottom (Mx) inter-layer dielectric (ILD) layer 302 embedded with a back end metal 304. In a particular embodiment, wafer structure 300 is produced as a result of a BEOL process. In particular embodiments, back end metal 304 includes one or more of copper or titanium nitride (TiN).

In block 1104, fabrication system 107 deposits first MRAM ILD layer 306 upon a top surface of bottom ILD layer 302 and back end metal 304. In a particular embodiment, first MRAM ILD layer 306 is a formed of a low-K dielectric material (e.g., having a small dielectric constant relative to silicon dioxide) such as silicon oxide (SiOx), silicon nitride (SiNx), silicon oxynitride (SiON), or silicon-boron carbonitride (SiBCN).

In block 1106, fabrication system 107 patterns the MRAM level and forms MTJ trench 308 having a particular angle within first MRAM ILD layer 306 extending to the top surface of back end metal 304 in which MTJ trench 308 has trapezoidal-shaped bottom at back end metal 304. In a particular embodiment, fabrication system 107 forms MTJ trench 308 via an RIE process using fluoro-carbon (FC) based chemistry process. In particular embodiments, fabrication system 107 forms MTJ trench 308 having an angle between approximately 40 degrees and 60 degrees depending upon the device effective critical dimension (CD).

In block 1108, fabrication system 107 deposits a plurality of magnetic stack layers of magnetic stack 310 and a top electrode layer 312 within MTJ trench 308. In one or more embodiments, fabrication system 107 deposits the magnetic stack layers of magnetic stack 310 and top electrode layer 312 using conformal deposition in which the magnetic stack layers of magnetic stack 310 and top electrode layer 312 conform to one or more contours of MTJ trench 308. In particular embodiments, fabrication system 107 deposits the magnetic stack layers of magnetic stack 310 and top electrode layer 312 using an atomic layer deposition (ALD) process such as ALD sputtering.

In a particular embodiment, the plurality of magnetic stack layers of magnetic stack 310 include a metal seed layer 314, a reference layer 316, a barrier layer 318, a free layer 320, and a dielectric cap layer 322. In the embodiment, metal seed layer 314 is deposited upon an upper surface of first MRAM ILD layer 306 and MTJ trench 308, reference layer 316 is deposited upon metal seed layer 314, barrier layer 318 is deposited upon reference layer 316, free layer 320 is deposited upon barrier layer 318, dielectric cap layer 322 is deposited upon free layer 320, and top electrode layer 312 is deposited upon dielectric cap layer 322.

In block 1110, fabrication system 107 planarizes the magnetic stack layers of magnetic stack 310 and top electrode layer 312 to remove portions of the magnetic stack layers of magnetic stack 310 and top electrode layer 312 to form a v-shaped MTJ 324 having a trapezoidal bottom in contact with back end metal 304. In a particular embodiment, fabrication system 107 planarizes the magnetic stack layers of magnetic stack 310 and top electrode layer 312 using a CMP process.

In block 1112, fabrication system 107 deposits second MRAM ILD layer (ILD2) 326 on a top surface of first MRAM ILD layer 306 and a top surface of the MTJ 324. In block 1114, fabrication system 107 patterns second MRAM ILD layer 326 to form a top via tunnel through second ILD layer 326 to an upper surface of MTJ 324. In block 1116, fabrication system 107 fills the top via tunnel with a metal material to form top via 328 in contact with MTJ 324 and planarizes top via 328 using a planarization process such as a CMP process.

In block 1118, fabrication system 107 forms top bit line 330 on an upper surface of second MRAM ILD layer 326 and top via 328. In a particular embodiment, fabrication system 107 forms top bit line 330 via a deposition process. In the embodiment, top bit line 330 is in electrical contact with MTJ 324 via top via 328. Fabrication system 107 ends process 1100 thereafter. Accordingly, an embedded MRAM device with a v-shaped magnetic tunnel junction (MTJ) profile is fabricated according to an embodiment.

Thus, a computer implemented method, system or apparatus, and computer program product are provided in the illustrative embodiments for fabricating an embedded MRAM device with a v-shaped magnetic tunnel junction (MTJ) profile in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus comprising:
   a wafer structure having a first inter-layer dielectric (ILD) layer and a metal material disposed within the first ILD layer;
   a second ILD layer upon a top surface of the first ILD layer and the metal material;
   a trench within the second ILD layer extending to the top surface of the metal material; and a v-shaped magnetic tunnel junction (MTJ) in contact with the metal material, the v-shaped MTJ including a metal seed layer, a reference layer, a barrier layer, a free layer, a dielectric cap layer, and an electrode layer within the trench, the barrier layer situated between the reference layer and the free layer, the dielectric cap layer situated between the free layer and the electrode layer, wherein the barrier layer, the free layer, the dielectric cap layer, and the electrode layer each have a singular vertex in a profile view of the apparatus, and wherein the reference layer comprises a first surface abutting the barrier layer and a second surface abutting the metal seed layer, the first surface having a singular vertex in the profile view of the apparatus and the second surface having two vertices and a flat portion therebetween in the profile view of the apparatus, and wherein an angle formed by the singular vertex is between approximately 40 degrees and approximately 60 degrees, a value of the angle selected based upon an effective critical dimension.

2. The apparatus of claim 1, wherein the trench includes a trapezoidal-shaped portion.

3. The apparatus of claim 1, wherein the v-shaped MTJ includes a portion in contact with the metal material.

4. The apparatus of claim 1, further comprising:
a third ILD layer deposited on a top surface of the second ILD layer and a top surface of the MTJ.

5. The apparatus of claim 4, further comprising:
a via formed within the third ILD layer in contact with the MTJ.

6. The apparatus of claim 5, further comprising:
a bit line formed on an upper surface of the third ILD layer and the via.

* * * * *